(12) United States Patent
Mariani

(10) Patent No.: US 6,504,416 B1
(45) Date of Patent: Jan. 7, 2003

(54) HIGH LINEARITY, LOW POWER VOLTAGE CONTROLLED RESISTOR

(75) Inventor: Giorgio Mariani, Phoenix, AZ (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/929,195

(22) Filed: Aug. 14, 2001

(51) Int. Cl.[7] .................................................. H03L 5/00
(52) U.S. Cl. ........................................................ 327/308
(58) Field of Search ................................. 327/308, 530, 327/534, 535, 537, 545, 546

(56) References Cited

U.S. PATENT DOCUMENTS 5,640,123 A * 6/1997 Akaogi et al. .............. 327/374

OTHER PUBLICATIONS

"A Wide Range Linear Variable Resistor by Buried Channel MOS/SIMOX," Masahiro Akiya, Sadao Nakashima and Kotaro Kato, IEEE Journal of Solid–State Circuits, vol. SC–19, No. 4, Aug. 1984.

"Continuous–Time MOSFET–C Filters in VLSI," Yannis Tsividis, Mihai Banu and John Khoury, IEEE Journal of Solid–State Circuits, vol. SC–21, No. 1, Feb. 1986.

"Six–Terminal MOSFET's: Modeling and Applications in Highly Linear, Electronically Tunable Resistors," Kostas Vavelidis, Yannis P. Tsividis, Frank Op't Eynde and Yannis Papananos, IEEE Journal of Solid–State Circuits, vol. 32, No. 1, Jan. 1997.

* cited by examiner

Primary Examiner—Jeffrey Zweizig
(74) Attorney, Agent, or Firm—Lisa K. Jorgenson; William A. Munck

(57) ABSTRACT

A number of voltage-controlled resistance cells, each formed by a transistor with a biasing capacitor connected between the gate and source and an associated controller coupled to the capacitor to maintain a steady charge on the biasing capacitor and keep the gate-source voltage at a control voltage corresponding to a desired resistance, are employed to form a voltage-controlled resistance structure. The gate voltage applied to each transistor is able to "float" together with the source voltage in order to keep the gate-source voltage constant, and the resistance structure exhibits improved voltage-dependent resistance linearity together with a larger range of biasing while lowering needed refresh frequencies to avoid noise injection.

20 Claims, 2 Drawing Sheets

HIGH LINEARITY, LOW POWER VOLTAGE CONTROLLED RESISTOR

TECHNICAL FIELD OF THE INVENTION

The present invention is directed, in general, to voltage controlled resistors and, more specifically, to voltage controlled resistors with high resistance-to-voltage linearity for use in tuning circuits and the like.

BACKGROUND OF THE INVENTION

Voltage controlled resistors, having a resistance which varies with an applied voltage, have use in a wide variety of applications, including, for example, tuning circuits. Metal oxide semiconductor (MOS) transistors may function as voltage controlled resistors if operated in the ohmic region, with the gate-source voltage controlling the resistance.

Within the signal path of a signal processing circuit, however, the resistance of an MOS transistor employed to provide voltage controlled resistance also changes with the source-drain voltage. If the gate voltage is held constant, the resistance of the transistor changes with the source voltage, introducing high non-linearity in the resistive behavior of the transistor. This non-linearity becomes higher as the overdrive voltage applied to the transistor—the gate-source voltage minus the threshold voltage (Vgs–Vt)—decreases. As the voltage supply becomes lower, providing a good overdrive of the transistor becomes increasingly difficult, particularly if the source (assuming an n-channel transistor) cannot be connected to ground.

There is, therefore, a need in the art for a voltage controlled resistor having a high linearity of resistance per unit change in applied voltage.

SUMMARY OF THE INVENTION

To address the above-discussed deficiencies of the prior art, it is a primary object of the present invention to provide, for use in an integrated circuit, a voltage-controlled resistance structure formed from a number of voltage-controlled resistance cells, each including a transistor with a biasing capacitor connected between the gate and source and an associated controller coupled to the capacitor to maintain a steady charge on the biasing capacitor and keep the gate-source voltage at a control voltage corresponding to a desired resistance. The gate voltage applied to each transistor is able to "float" together with the source voltage in order to keep the gate-source voltage constant, and the resistance structure exhibits improved voltage-dependent resistance linearity together with a larger range of biasing while lowering needed refresh frequencies to avoid noise injection.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 6, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

Figure 1:
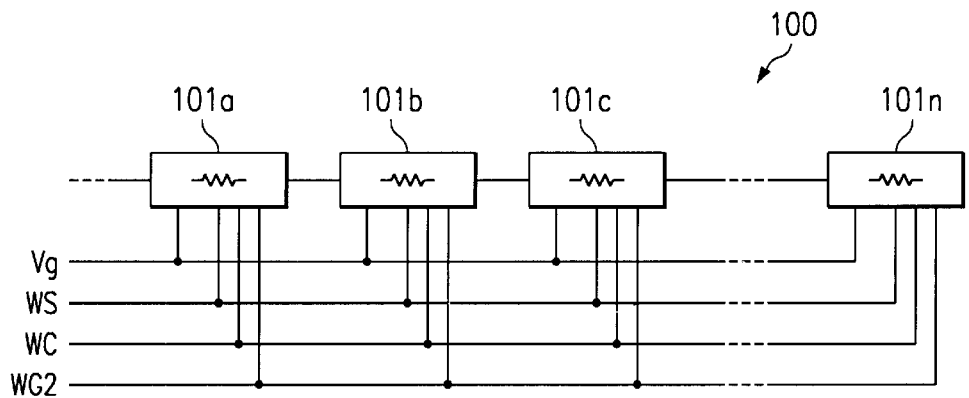
FIG. 1 depicts a voltage controlled resistance structure according to one embodiment of the present invention.

FIG. 1 depicts a voltage controlled resistance structure according to one embodiment of the present invention. Voltage controlled resistance structure 100 includes a set of n (where n is any positive integer) voltage controlled resistance cells 101a–101n connected in series. In the exemplary embodiment, each voltage controlled resistance cell 101a–101n receives three control signals WS, WC and WG2 in addition to a control voltage Vg, as described in further detail below.

Figure 2:
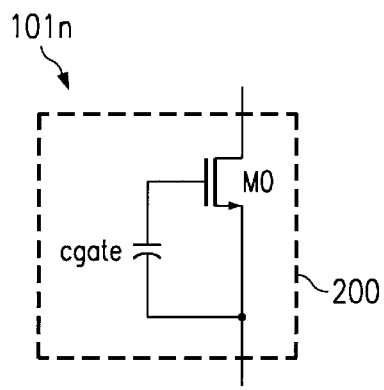
FIG. 2 illustrates in greater detail a voltage controlled resistor portion of a resistance cell according to one embodiment of the present invention.

FIG. 2 illustrates in greater detail a voltage controlled resistor portion of each resistance cell according to one embodiment of the present invention. Each resistance cell 101n includes voltage controller resistor 200 formed by a metal oxide semiconductor (MOS) field effect transistor M0 (an n-channel transistor in the exemplary embodiment) with a capacitor cgate connecting the gate to the source. If the charge of capacitor agate is kept constant, then the gate-source voltage Vgs—and the channel resistance, as well—of transistor M0 will also remain constant. In this configuration, because no direct current (DC) path exists which can discharge the capacitor cgate, any variation in the source voltage Vs will automatically result in the same variation of the gate voltage Vg, keeping the gate-source voltage Vgs constant in this manner. The resistance structure of FIG. 1 is formed by connected the source of transistor M0 in one resistance cell to the drain of transistor M0 in another transistor cell.

Figure 3:
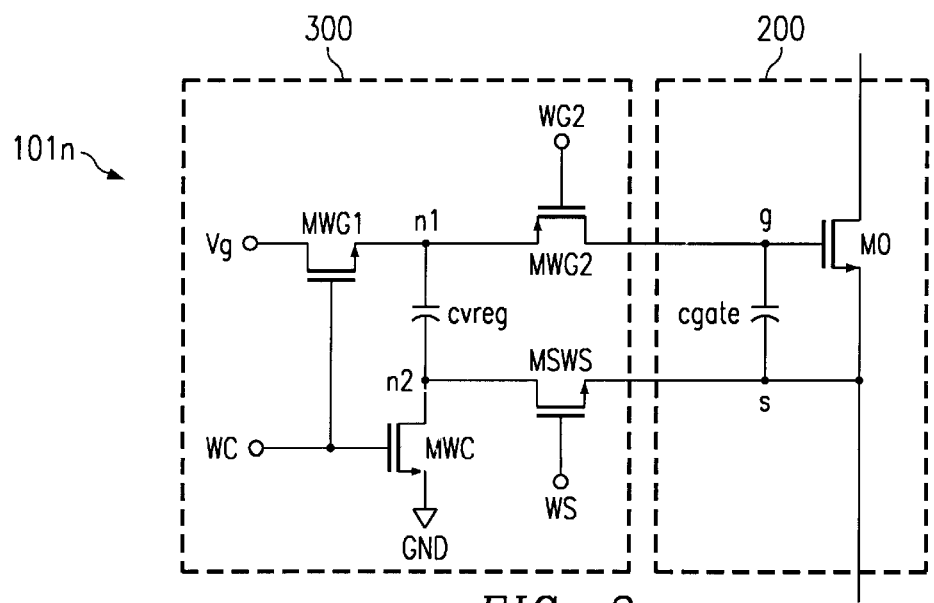
FIG. 3 illustrates a voltage controlled resistor and associated controller for a resistance cell according to one embodiment of the present invention.

FIG. 3 illustrates a voltage controlled resistor and associated controller for each resistance cell according to one embodiment of the present invention. As with the circuit of FIG. 2, the resistance structure of FIG. 1 is formed by connected the source of transistor M0 in one resistance cell to the drain of transistor M0 in another transistor cell. The associated controller 300 for each resistance cell is not interconnected with controllers for other resistance cells, although each receives the same control inputs WC, WS and WG2.

Controller 300 is employed with each resistance cell 101n in order to maintain a constant charge on capacitor cgate within voltage controlled resistor 200. Controller 300 includes two transistors MWG1 and MWG2 connected in series between the gate (node g) of transistor M0 and the input for control voltage Vg. Transistors MWG1 and MWG2 are an n-channel transistor and a p-channel transistor, respectively, in the exemplary embodiment, having their sources connected together with the drain of transistor MWG1 connected to the control voltage input Vg and the drain of transistor MWG2 connected to the gate of transistor M0. The gate-source voltage Vgs which is to be "translated" into a resistance is applied to the control voltage input Vg.

Controller 300 also includes a capacitor cvreg connected in parallel with the capacitor cgate by transistor MWG2, which connects one terminal of capacitor cvreg to a terminal (node n1) of capacitor cgate and to the gate of transistor M0 (node g), and by transistor MSWS, an n-channel transistor in the exemplary embodiment which connects the other terminal (node n2) of capacitor cvreg to both the second terminal of capacitor cgate and the source of transistor M0 (node s). The gate of transistor MWG2 is connected to the control input WG2 while the gate of transistor MSWS is connected to the control input WS.

Transistor MSWS is connected at the source to capacitor cgate and the source of transistor M0 (node s) and at the drain to capacitor cvreg and the drain of transistor MWC (node n2). Transistor MWC, an n-channel transistor in the exemplary embodiment, is connected at the source to a ground voltage level gnd and a the gate to both the gate of transistor MWG1 and the control input WC.

In operation, when control input WS is high and control inputs WG2 and WC are both low, transistors MWG2 and MSWS are on, shorting capacitors cvreg and cgate together, while transistors MWG1 and MWc are both off. Both capacitors cvreg and cgate are therefore allowed to "follow" the voltage at the source of transistor M0 (node s). When control input WS goes low and control input WG2 goes high (while control input WC remains low), transistors MWG2 and MSWS are off, thus disconnecting capacitor cvreg from capacitor cgate, although capacitor cgate is still allowed to "float" and follow the voltage at the source of transistor M0 (node s). Once disconnected from capacitor cgate, capacitor cvreg is ready to be recharged by the input voltage Vg, which is enabled by control input WC going high and turning on transistors MWG1 and MWC.

Figure 4:
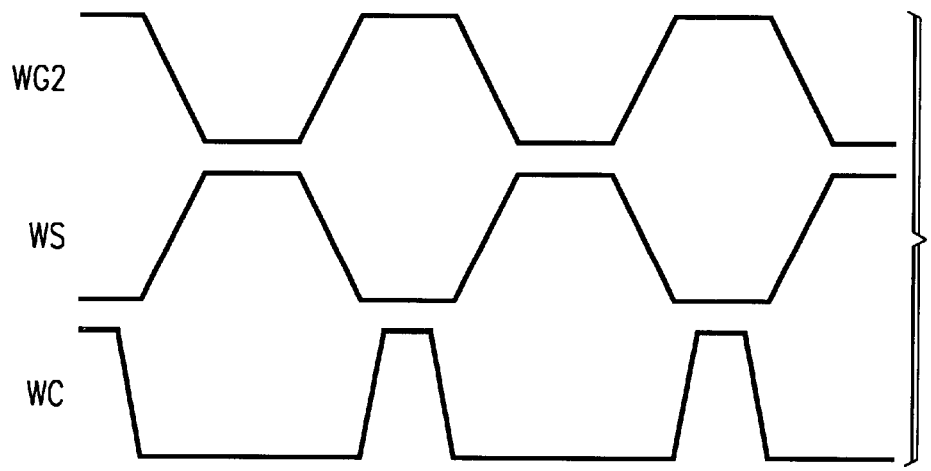
FIG. 4 illustrates a timing diagram for driving the control inputs to voltage controlled resistor and associated controller for each resistance cell according to one embodiment of the present invention.

FIG. 4 illustrates a timing diagram for driving the control inputs to voltage controlled resistor and associated controller for each resistance cell according to one embodiment of the present invention. The control signals shown are applied to the control inputs WC, WS and WG2 of the circuits in FIGS. 1 and 3. As shown, control inputs WG2 and WS are inversely related, and control input WC is driven high only while control input WS is low and control input WG2 is high, disconnecting capacitor cvreg from capacitor cgate.

The voltage controlled resistance structure of the present invention has several advantages over other voltage controlled resistance structures: Power dissipation is very small, since only a small amount of charge is needed to compensate the losses on the capacitors (leakage currents) once the circuit has reached rest biasing. By connecting a number of resistance cells of the type disclosed in series, the variation of each source-drain voltage (Vds) is smaller, so that the resistance is much more linear over the Vds variation, which is now reduced.

Figure 5:
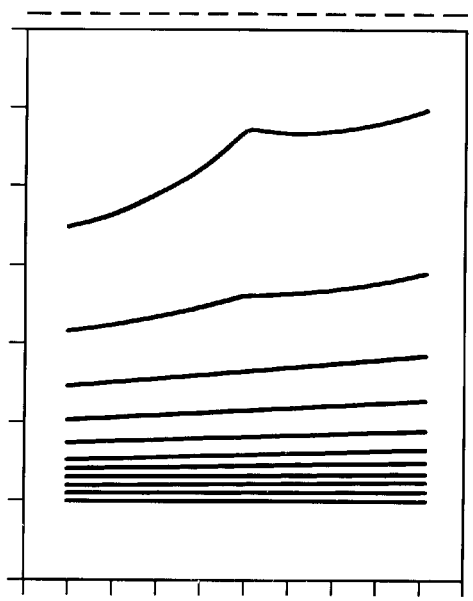
FIG. 5 depicts a plot of the voltage-dependent resistance of a resistance structure having 10 resistance cells according to one embodiment of the present invention connected in series.
Figure 6:
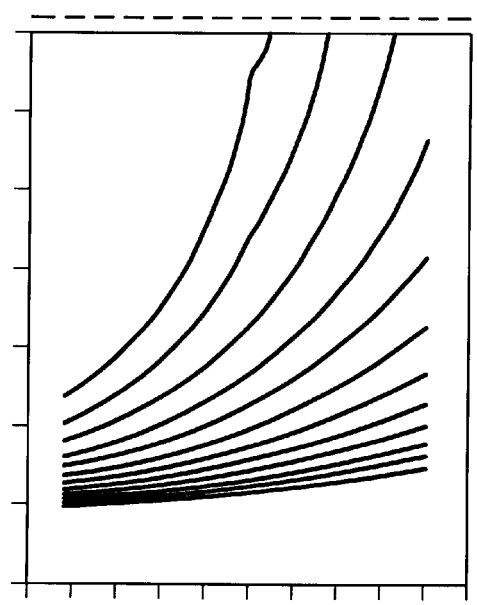
FIG. 6 depicts a plot of the voltage-dependent resistance of a resistance structure having only one resistance cell according to one embodiment of the present invention.

FIGS. 5 and 6 illustrate the improvement of resistance linearity as the number of resistance cells connected in series to form a voltage controlled resistance structure increases. In both plots, the horizontal axis represents the voltage drop across the entire resistance structure, while the vertical axis represents resistance. In the ideal case, the lines should be horizontal (no resistance variation when the applied voltage changes). The different steps correlate to the differing values of gate-source voltage (Vgs) applied to the resistance structure (where the same Vgs is applied to each transistor). FIG. 5 depicts the voltage-dependent resistance of a resistance structure having 10 resistance cells according to the present invention connected in series; FIG. 6 depicts the voltage-dependent resistance of a resistance structure having only one resistance cell according to the present invention.

The improved voltage-dependent resistance linearity of the voltage-controlled resistance structure of the present invention is possible because the gate-source voltage Vgs applied to each transistor is able to "float", together with the source voltage, which also allows a larger range of biasing since if the voltage at the sources (node s) of each transistor M0 grows, the voltage at the gate (node g) also grows and may even become higher than the supply voltage if necessary (and not harmful to the circuit). The improved voltage-dependent resistance linearity within the voltage-controlled resistance structure of the present invention also allows the frequency of the refreshing signals (control inputs WC, WS and WG2) to be relatively low, limiting problems due to noise injection on nodes sensitive to such problems.

Although the present invention has been described in detail, those skilled in the art will understand that various changes, substitutions, and alterations herein may be made without departing from the spirit and scope of the invention in its broadest form.

What is claimed is:

1. For use in an integrated circuit, a voltage controlled resistance cell for provided a voltage-controlled variable resistance having improved voltage-dependent resistance linearity comprising:

a transistor providing a voltage-controlled resistance between a drain and a source of the transistor in response to a control voltage applied across a gate and the source of the transistor;

a biasing capacitor connected between the gate and the source, the biasing capacitor maintaining a gate-source voltage on the voltage-controlled resistance transistor to produce a corresponding resistance between the drain and the source of the voltage-controlled resistance transistor; and a controller coupled to the capacitor and maintaining a steady charge on the capacitor.

2. The voltage controlled resistance cell as set forth in claim 1 wherein the controller further comprises:

a regulating capacitor capable of being selectively coupled in parallel with the biasing capacitor, the regulating capacitor receiving the control voltage and passing the control voltage to the biasing capacitor when coupled to the biasing capacitor.

3. The voltage controlled resistance cell as set forth in claim 2 wherein the controller further comprises:

a first transistor coupling a first terminal of the regulating capacitor to a first terminal of the biasing capacitor; and a second transistor coupling a second terminal of the regulating capacitor to a second terminal of the biasing capacitor, wherein the regulating capacitor is coupled to the biasing capacitor when the first and second transistors are on.

4. The voltage controlled resistance cell as set forth in claim 3 wherein the controller further comprises:

a third transistor coupling the first terminal of the regulating capacitor to a control voltage input; and a fourth transistor coupling the second terminal of the regulating capacitor to a ground voltage.

5. The voltage controlled resistance cell as set forth in claim 1 wherein the controller sets the gate-source voltage on the voltage-controlled resistance transistor to the control voltage.

6. The voltage controlled resistance cell as set forth in claim 1 wherein the voltage-controlled resistance transistor forms a portion of a voltage controlled resistance structure when the drain of the voltage-controlled resistance transistor is connected to a source of a voltage-controlled resistance transistor within another resistance cell.

7. A voltage controlled resistance structure comprising:

a plurality of voltage controlled resistance cells connected in series for provided a voltage-controlled variable resistance having improved voltage-dependent resistance linearity, each resistance cell comprising:

a transistor providing a voltage-controlled resistance between a drain and a source of the transistor in response to a control voltage applied across a gate and the source of the transistor;

a biasing capacitor connected between the gate and the source, the biasing capacitor maintaining a gate-source voltage on the voltage-controlled resistance transistor to produce a corresponding resistance between the drain and the source of the voltage-controlled resistance transistor; and a controller coupled to the capacitor and maintaining a steady charge on the capacitor.

8. The voltage controlled resistance structure as set forth in claim 7 wherein the controller for each resistance cell further comprises:

a regulating capacitor capable of being selectively coupled in parallel with the biasing capacitor, the regulating capacitor receiving the control voltage and passing the control voltage to the biasing capacitor when coupled to the biasing capacitor.

9. The voltage controlled resistance structure as set forth in claim 8 wherein the controller for each resistance cell further comprises:

a first transistor coupling a first terminal of the regulating capacitor to a first terminal of the biasing capacitor; and a second transistor coupling a second terminal of the regulating capacitor to a second terminal of the biasing capacitor, wherein the regulating capacitor is coupled to the biasing capacitor when the first and second transistors are on.

10. The voltage controlled resistance structure as set forth in claim 9 wherein the controller for each resistance cell further comprises:

a third transistor coupling the first terminal of the regulating capacitor to a control voltage input; and a fourth transistor coupling the second terminal of the regulating capacitor to a ground voltage.

11. The voltage controlled resistance structure as set forth in claim 10 wherein the controller for each resistance cell sets the gate-source voltage on the voltage-controlled resistance transistor within the corresponding resistance cell to the control voltage.

12. The voltage controlled resistance structure as set forth in claim 10 wherein the controller for each resistance cell further comprises:

a first input for receiving the control voltage;

a second input for receiving a first control signal controlling the first transistor;

a third input for receiving a second control signal controlling the second transistor; and a fourth input for receiving a third control signal controlling the third and fourth transistors.

13. For use in an integrated circuit, a method of controlling a voltage controlled resistance comprising:

applying a control voltage across a gate and a source of at least one voltage-controlled resistance transistor and across at least one biasing capacitor connected between the gate and the source, the at least one voltage-controlled resistance transistor producing a resistance corresponding to the control voltage between a drain and the source of the at least one voltage-controlled resistance transistor; and maintaining a steady charge on the at least one biasing capacitor.

14. The method as set forth in claim 13 wherein the step of applying a control voltage across a gate and a source of at least one voltage-controlled resistance transistor and across at least one biasing capacitor connected between the gate and the source further comprises:

applying the control voltage across a gate and a source of each of a plurality of voltage-controlled resistance transistors connected in series and across a plurality of biasing capacitors each connected between the gate and source of one of the plurality of voltage-controlled resistance transistors.

15. The method as set forth in claim 14 wherein the step of maintaining a steady charge on the at least one biasing capacitor further comprises:

maintaining a steady charge on each of the plurality of biasing capacitors.

16. The method as set forth in claim 13 wherein the step of maintaining a steady charge on the at least one biasing capacitor further comprises:

selectively coupling a regulating capacitor to the at least one biasing capacitor, wherein the regulating capacitor is capable of being selectively coupled to the control voltage.

17. The method as set forth in claim 16 further comprising:
selectively coupling one terminal of the regulating capacitor to the control voltage and a second terminal of the regulating capacitor to a ground voltage.

18. The method as set forth in claim 17 further comprising:
disconnecting the regulating capacitor from the biasing capacitor before coupling the regulating capacitor to the control voltage and disconnecting the regulating capacitor from the control voltage before recoupling the regulating capacitor to the biasing capacitor.

19. The method as set forth in claim 17 further comprising:
periodically the regulating capacitor to the control voltage and to the biasing capacitor in sequence.

20. The method as set forth in claim 17 further comprising:
driving a common set of control signals to periodically refresh or alter the control voltage applied to across the gate and source of each of the plurality of voltage-controlled resistance transistors.

* * * * *